US010957963B2

(12) United States Patent
Dell'Orto et al.

(10) Patent No.: US 10,957,963 B2
(45) Date of Patent: Mar. 23, 2021

(54) OPTIMISED RF INPUT SECTION FOR COPLANAR TRANSMISSION LINE

(71) Applicant: Oclaro Technology Limited, Northamptonshire (GB)

(72) Inventors: Flavio Dell'Orto, Desio (IT); Stefano Balsamo, Milan (IT); Mario Bonazzoli, Cremona (IT)

(73) Assignee: Lumentum Technology UK Limited, Northamptonshire (GB)

( * ) Notice: Subject to any disclaimer, the term of this patent is extended or adjusted under 35 U.S.C. 154(b) by 118 days.

(21) Appl. No.: 16/305,484

(22) PCT Filed: Jun. 6, 2017

(86) PCT No.: PCT/GB2017/051623
§ 371 (c)(1),
(2) Date: Nov. 29, 2018

(87) PCT Pub. No.: WO2017/212237
PCT Pub. Date: Dec. 14, 2017

(65) Prior Publication Data
US 2020/0127356 A1  Apr. 23, 2020

(30) Foreign Application Priority Data
Jun. 6, 2016  (GB) .................................... 1609816

(51) Int. Cl.
*H03H 7/38* (2006.01)
*H01P 3/00* (2006.01)

(52) U.S. Cl.
CPC ............... *H01P 3/003* (2013.01); *H03H 7/38* (2013.01)

(58) Field of Classification Search
CPC ............ H03H 7/38; H01P 3/003; H01P 5/085
USPC .............................. 333/33, 34, 238, 246, 247
See application file for complete search history.

(56) References Cited

U.S. PATENT DOCUMENTS

| 4,739,519 A | 4/1988 | Findley |
| 5,194,833 A | 3/1993 | Dougherty et al. |
| 5,404,117 A * | 4/1995 | Walz ........................ H01P 5/085 333/260 |

(Continued)

FOREIGN PATENT DOCUMENTS

| CN | 1415990 A | 5/2003 |
| CN | 1812186 A | 8/2006 |

(Continued)

OTHER PUBLICATIONS

Intellectual Property Office of the United Kingdom, Patents Act 1977: Search Report under Section 17(5), Application No. GB1609816.2, dated Dec. 2, 2016, 5 Pages.

(Continued)

*Primary Examiner* — Stephen E. Jones
(74) *Attorney, Agent, or Firm* — Harrity & Harrity, LLP

(57) ABSTRACT

A chip comprising a bonding pad region and a transmission section. The bonding pad region has a first impedance, and is configured for electrical connection to an external transmission line. The transmission section extends away from the bonding pad region and has a second impedance. The bonding pad region is configured to enable field confinement and field matching between the bonding pad region and the external transmission line, and the second impedance is not equal to the first impedance.

10 Claims, 2 Drawing Sheets

(56) References Cited

U.S. PATENT DOCUMENTS

| | | | |
|---|---|---|---|
| 5,418,505 A * | 5/1995 | Agarwal | ................ H01P 5/085 |
| | | | 333/246 |
| 5,424,693 A | 6/1995 | Lin | |
| 5,583,468 A | 12/1996 | Kielmeyer et al. | |
| 9,287,604 B1 * | 3/2016 | Noujeim | ................... H01P 5/08 |
| 2003/0228107 A1 | 12/2003 | Howerton et al. | |
| 2005/0184825 A1 | 8/2005 | Oran | |

FOREIGN PATENT DOCUMENTS

| | | | |
|---|---|---|---|
| CN | 101996972 A | | 3/2011 |
| GB | 2197081 A | | 5/1988 |
| JP | 2003-163510 A | | 6/2003 |
| JP | 2003163510 A | | 6/2003 |
| WO | 0046921 A1 | | 8/2000 |
| WO | WO 00/046921 | | 8/2000 |
| WO | 0101451 A2 | | 1/2001 |
| WO | WO 01/01451 A2 | | 1/2001 |
| WO | 2004017516 A1 | | 2/2004 |

OTHER PUBLICATIONS

Patent Cooperation Treaty, International Search Report and Written Opinion of the International Searching Authority, International Patent Application No. No. PCT/GB2017/051623, dated Sep. 6, 2017, 12 Pages.

International Search Report and Written Opinion for Application No. PCT/GB2017/051623, dated Sep. 6, 2017, 9 pages.

* cited by examiner

OPTIMISED RF INPUT SECTION FOR COPLANAR TRANSMISSION LINE

RELATED APPLICATIONS

This application is a 35 U.S.C. 371 national stage filing of International Application No. PCT/GB2017/051623, filed on Jun. 6, 2017, which claims priority from United Kingdom Application No. GB1609816.2 filed on Jun. 6, 2016. The contents of the aforementioned applications are hereby incorporated by reference in their entireties.

TECHNICAL FIELD

The present invention relates to in input/output section of a chip for bonding to an external RF transmission line. In particular, the present invention relates to a bonding section between an RF transmission line and a substrate.

BACKGROUND

In many RF components, such as modulators, there is a need to connect an external transmission line to a chip. This is typically done by using a set of bonding pads on the chip for electrical connection to the external transmission line. Connection may be achieved using bonding wires, although it will be appreciated that other approaches such as, for example, a flip chip, may also be employed. Typically, a transmission section on the chip may extend away from the connection towards electrical componentry on the chip. An exemplary top view of an edge region of a chip with a bonding pad is shown in FIG. 1. The RF circuitry comprises a body region 101 (for transmission away from the edge of the chip), a bonding pad region 102, and a taper 103 at the transition between the bonding pad region 102 and body region 101. The body region is effectively itself a flat transmission line with a ground electrode 111 either side of a signal electrode 112. The bonding pad region 102 connects to an external transmission line 104 (shown schematically in FIG. 1). The external transmission line could be coaxial or flat. The pads 121, 122 in the bonding pad region are wider than the electrodes 111, 112 in the body region, in order to allow a secure connection to the external transmission line to be made. The connection may also be placed away from the edge region of the chip.

In order to maintain substantially the same impedance as the body section (in order to reduce losses to signals traversing the bonding pad), the gaps between the signal pad 122 and the ground pads(s) 121 of the chip need to be greater than the corresponding gaps between the signal electrode 112 and the ground electrode(s) 111 of the body section, creating a wide cross section for the bonding region.

SUMMARY

It has now been found that at high frequencies (e.g. >40 GHz), the wide gaps in the bonding region cause an unwanted high-frequency rolloff. At high frequencies, the wide electric field distribution caused by the large gaps results in significant losses due to electromagnetic radiation. It has been found that these losses are surprisingly much larger than the losses associated with impedance mismatch in the bonding region.

According to a first aspect of the invention, there is provided a chip comprising a bonding pad region and a transmission section. The bonding pad region has a first impedance, and is configured for electrical connection to an external transmission line. The transmission section extends away from the bonding pad region and has a second impedance. The bonding pad region is configured to enable field confinement and field matching between the bonding pad region and the external transmission line, and the second impedance is not equal to the first impedance.

The transmission section may comprise a signal electrode and a ground electrode, and a first non-conductive gap between the signal electrode and the ground electrode, and the bonding pad region may comprise a signal pad electrically connected to the signal electrode and a ground pad electrically connected to the ground electrode, and a second non-conductive gap between the signal and ground pad, wherein a width of the second non-conductive gap is less than a width of either the signal pad or the ground pad.

According to a further aspect, there is provided a chip comprising a bonding pad region and a transmission section. The bonding pad region comprises a signal pad and a ground pad, has a first impedance, and is configured for electrical connection to an external transmission line. The transmission section extends away from the bonding pad region and comprises a signal electrode electrically connected to the signal pad and a ground electrode electrically connected to the ground pad. The transmission section has a second impedance. The transmission section comprises a first non-conductive gap between the signal electrode and the ground electrode, and the bonding pad region comprises a second non-conductive gap between the signal pad and the ground pad. The width of the second non-conductive gap is less than a width of either the signal pad or the ground pad and the second impedance is not equal to the first impedance.

Further embodiments are set out in claim 2 et seq.

DETAILED DESCRIPTION

At high frequencies, it has been found that the "common sense" approach of maintaining constant impedance through the chip, the bonding region, and the transmission line in fact results in higher losses due to radiation and lack of confinement of the electrical field in the chip.

The bonding region can instead be constructed to minimise radiative losses by "field matching", i.e. constructing the bonding region to improve confinement of the electrical field at the interface between the chip and the external transmission line. This will typically result in a mismatch in impedance, but the losses from the impedance mismatch will be outweighed by the reduction in radiative losses. The impedance losses can be reduced by ensuring that the line and the chip are matched in impedance, and by keeping the bonding region short, e.g. less than 100 microns in length.

Figure 1:
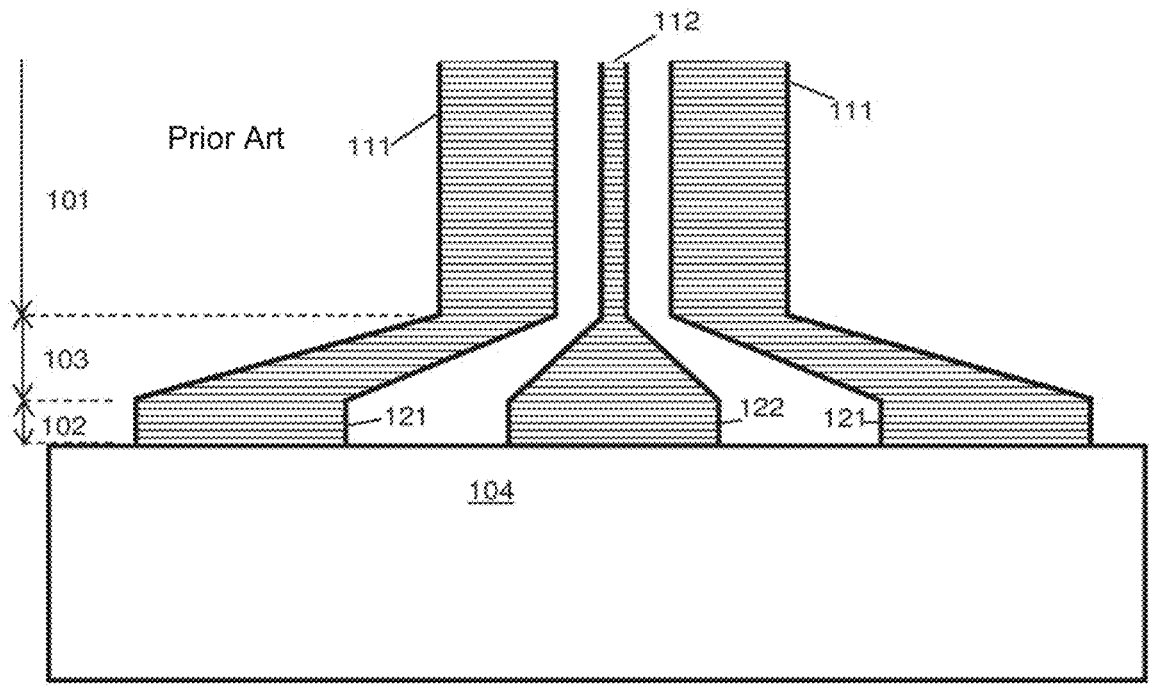
FIG. 1 shows a schematic top view of an edge region of a chip with a bonding pad according to the prior art.
Figure 2:
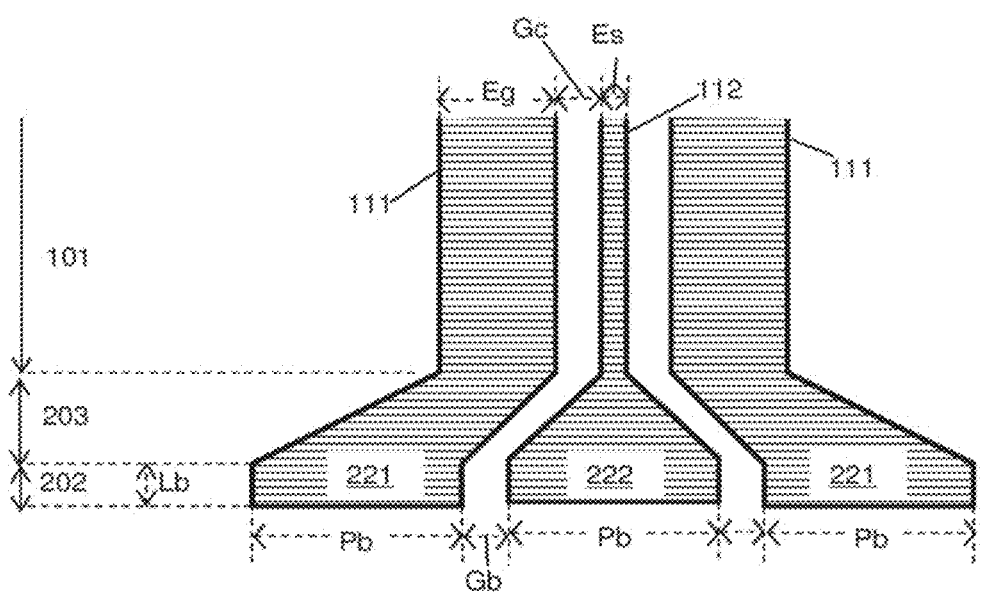
FIG. 2 shows a schematic top view of an edge region of a chip with a bonding pad according to an embodiment.

As an example, such a construction may be made by reducing the width of the gaps in the bonding region, as shown in FIG. 2. The transmission section 101 has a ground electrode width Eg, a signal electrode width Es, a gap width Gc, and an impedance Zc. The bonding region 202 has a gap width Gb, a length Lb, an impedance Zb, and pads 221, 222 with a pad width Pb. The external transmission line (not shown in FIG. 2) has an impedance Zt, which is approximately the same as Zc. In a conventional bond, such as that shown in FIG. 1, Zb=Zt=Zc. In order to achieve this, Gb≈Pb. However, since Pb must be relatively large in order to permit a good connection to be made to the external transmission line, this makes the overall size of the bonding pad sufficiently large that radiative losses are significant. In the construction of FIG. 2, this is overcome by making Gb<<Pb, for example Gb≈Gc. As a result, Zb<<Zc. The taper 203 between the bonding pad region 202 and the transmission line body 101 transitions between the bonding pad width Pb and the electrode widths Eg & Es, and between the gap widths Gb and Gc As an example, Lb may be 100 microns or less, and optionally about 80 microns. Gb should be small, and may be less than 80 microns, optionally about 50 microns or even 25 microns. Pb may be of the order of 130 microns although larger widths such as 175 microns are also possible. A larger pad allows a double bonding connection. However, exemplary dimensions include:

Pb 80 microns, GB 25 microns
Pb 80 microns, Gb 50 microns
Pb 130 microns, Gb 50 microns
Pb 175 microns, Gb 80 microns.

These dimensions are generally designed to ensure field confinement and field matching between the bonding pad region and the external transmission line.

It will be apparent that the arrangement may be used with typical wire bonding connections, but may also be used in conjunction with flip chip connections. The term "bonding region" as used herein can apply to connections of both types.

Figure 3:
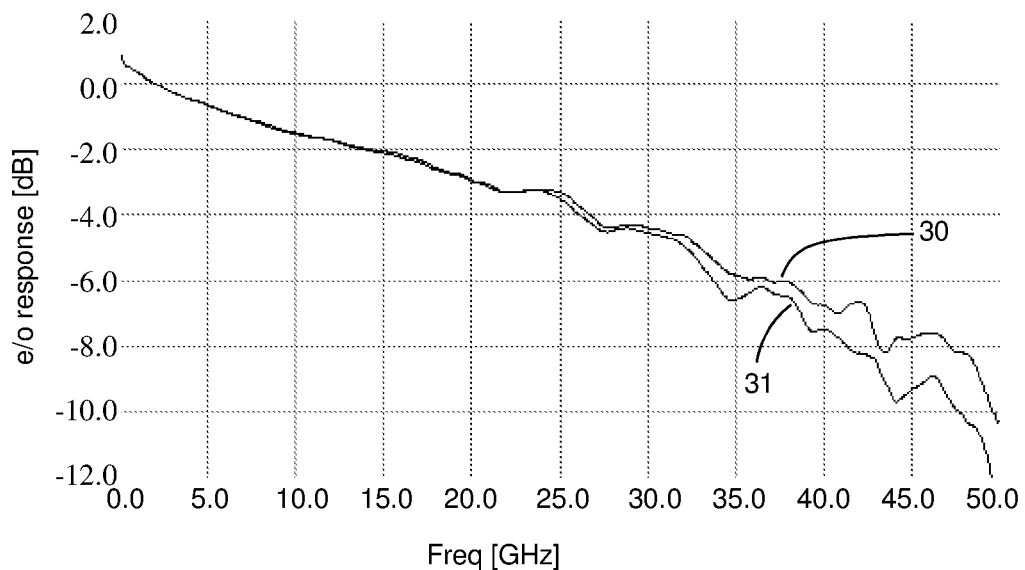
FIG. 3 shows a comparison of the performance of bonding sections according to FIGS. 1 and 2.

FIG. 3 is a graph of frequency response for a prior art bonding section 31 and a bonding section 32 according to FIG. 2. As can be seen, the fall-off in performance at high frequencies is smaller for the new arrangement. The difference becomes apparent at around 20 GHz, and the fall-off is significantly lower at higher frequencies. At no point does the impedance mismatch cause the new bonding section to have noticeably worse performance than the prior art bonding section, despite the general consideration in the art that impedance matching is important.

The balance between radiative losses and impedance losses will depend partially on the material of the chip. The results in FIG. 3 were obtained for a LiNbO$_3$ substrate.

In most cases, there is likely to be some trade-off between radiative and impedance losses—in the geometry shown in FIG. 2, the impedance losses are likely to be significant for Gb<5 microns. However, this is similar to the limits set by engineering tolerances of the components.

The matching to reduce radiative losses is particularly important for high-frequency devices, as can be seen from FIG. 3, but is likely to be applicable to lower frequency applications (although with smaller efficiency gains).

The external transmission line may be a flat transmission line with a ground electrode either side of a signal electrode, or it may be a co-axial transmission line with a single ground electrode surrounding a signal electrode. Other geometries are also possible, as will be appreciated by the skilled person. As discussed above, where the external transmission line is flat it may be connected to the bonding section by a flip chip connection.

Figure 4:
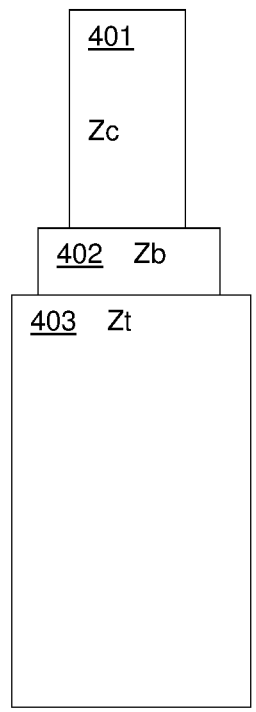
FIG. 4 is a schematic of a bonding pad according to one embodiment.

FIG. 4 is a schematic of a transmission section of a chip. The transmission section has a body region 401 with impedance Zc, and a bonding pad region 402 with impedance Zb. The bonding pad region 402 is electrically connected to the body 401, and configured to electrically connect to an external transmission line 403 with impedance Zt. The bonding pad Zb is configured to allow field matching between the bonding pad and the external transmission line, i.e. to reduce radiative losses at the connection between the bonding pad region and the external transmission line. Zb is not equal to Zc.

It will be appreciated that the bonding section will usually be at or close to the edge of the chip, but other configurations may also be possible.

The invention claimed is:

1. A system comprising:
   an external transmission line, and
   a chip comprising:
      a bonding pad region comprising a signal pad and a ground pad, the bonding pad region having a first impedance and being connected to the external transmission line;
      a transmission section extending away from the bonding pad region and comprising a signal electrode electrically connected to the signal pad and a ground electrode electrically connected to the ground pad, the transmission section having a second impedance;
   wherein:
      the transmission section comprises a first non-conductive gap between the signal electrode and the ground electrode, and the bonding pad region comprises a second non-conductive gap between the signal pad and the ground pad;
      a width of the second non-conductive gap is less than a width of either the signal pad or the ground pad;
      an impedance of the external transmission line is equal to the second impedance; and
      the second impedance is not equal to the first impedance as a result of the width of the second non-conductive gap being less than the width of either the signal pad or the ground pad.

2. The system according to claim 1, wherein the width of the second non-conducting gap is equal to a width of the first non-conducting gap.

3. The system according to claim 1, wherein the width of the second non-conducting gap is less than 50% of the width of the signal or ground pad.

4. The system according to claim 1, wherein the width of the second non-conducting gap is 80 microns or less.

5. The system according to claim 1, wherein the transmission section comprises two ground electrodes spaced equidistantly each side of the signal electrode, and the bonding pad region comprises two ground pads spaced equidistantly either side of the signal pad, each electrically connected to a corresponding ground electrode.

6. The system according to claim 1, wherein the transmission section is configured to process radiofrequency (RF) signals.

7. The system according to claim 1, wherein the first impedance is less than the second impedance.

8. The system according to claim 1, wherein the bonding pad region is about 100 microns or less in length.

9. The system according to claim 1, wherein the chip is a LiNbQ$_3$ chip.

10. A modulator comprising the system according to claim 1.

* * * * *